(12) United States Patent
Aoki et al.

(10) Patent No.: US 8,643,114 B2
(45) Date of Patent: Feb. 4, 2014

(54) SEMICONDUCTOR DEVICE AND ELECTRONIC APPARATUS

(75) Inventors: Takashi Aoki, Suwa (JP); Mutsumi Kimura, Otsu (JP); Takashi Nakanishi, Otsu (JP); Mariko Sakemi, Otsu (JP)

(73) Assignees: Seiko Epson Corporation, Tokyo (JP); Ryukoku University, Kyoto-shi (JP)

( * ) Notice: Subject to any disclaimer, the term of this patent is extended or adjusted under 35 U.S.C. 154(b) by 352 days.

(21) Appl. No.: 12/820,252

(22) Filed: Jun. 22, 2010

(65) Prior Publication Data

US 2010/0327282 A1 Dec. 30, 2010

(30) Foreign Application Priority Data

Jun. 25, 2009 (JP) ................... 2009-150769

(51) Int. Cl.
*H01L 29/66* (2006.01)
(52) U.S. Cl.
USPC ................... 257/369; 257/E27.064
(58) Field of Classification Search
USPC ........... 257/206, E27.064, E51.005–E51.006, 257/351, 369
See application file for complete search history.

(56) References Cited

U.S. PATENT DOCUMENTS

| | | | |
|---|---|---|---|
| 4,987,092 A * | 1/1991 | Kobayashi et al. | ........... 438/153 |
| 5,567,959 A | 10/1996 | Mineji | |
| 5,625,199 A | 4/1997 | Baumbach et al. | |
| 6,528,816 B1 * | 3/2003 | Jackson et al. | ................... 257/40 |
| 6,649,980 B2 * | 11/2003 | Noguchi | ........................ 257/351 |
| 6,657,229 B1 * | 12/2003 | Eguchi et al. | .................... 257/67 |
| 7,368,337 B2 * | 5/2008 | Ban | ........................ 257/E27.062 |
| 7,397,072 B2 * | 7/2008 | Dodabalapur et al. | ........ 257/253 |
| 2004/0065927 A1 * | 4/2004 | Bhattacharyya | ............. 257/369 |
| 2006/0267005 A1 * | 11/2006 | Kawase et al. | ........ 257/E51.006 |
| 2008/0197343 A1 | 8/2008 | Blache et al. | |

FOREIGN PATENT DOCUMENTS

| | | |
|---|---|---|
| JP | H06-125013 A | 5/1994 |
| JP | 07-193251 A | 7/1995 |
| JP | 09-199732 A | 7/1997 |
| JP | 2001-284597 A | 10/2001 |
| JP | 2002-518844 A | 6/2002 |
| JP | 2002-244153 A | 8/2002 |
| JP | 2004-228587 A | 8/2004 |
| JP | 2006-278621 A | 10/2006 |
| JP | 2007-251100 A | 9/2007 |
| JP | 2008-523595 A | 7/2008 |
| JP | 2009-076644 | 4/2009 |
| WO | WO-99/66540 A | 12/1999 |

* cited by examiner

*Primary Examiner* — Stephen W Smoot
*Assistant Examiner* — Sun M Kim
(74) *Attorney, Agent, or Firm* — ALG Intellectual Property, LLC

(57) ABSTRACT

A semiconductor device includes: a substrate; a p-type organic transistor including an organic semiconductor layer arranged on or above the substrate; and an n-type inorganic transistor including an inorganic semiconductor layer arranged on or above the organic transistor, wherein a channel region of the inorganic transistor overlaps a channel region of the organic transistor at least partially in a plan view.

11 Claims, 11 Drawing Sheets

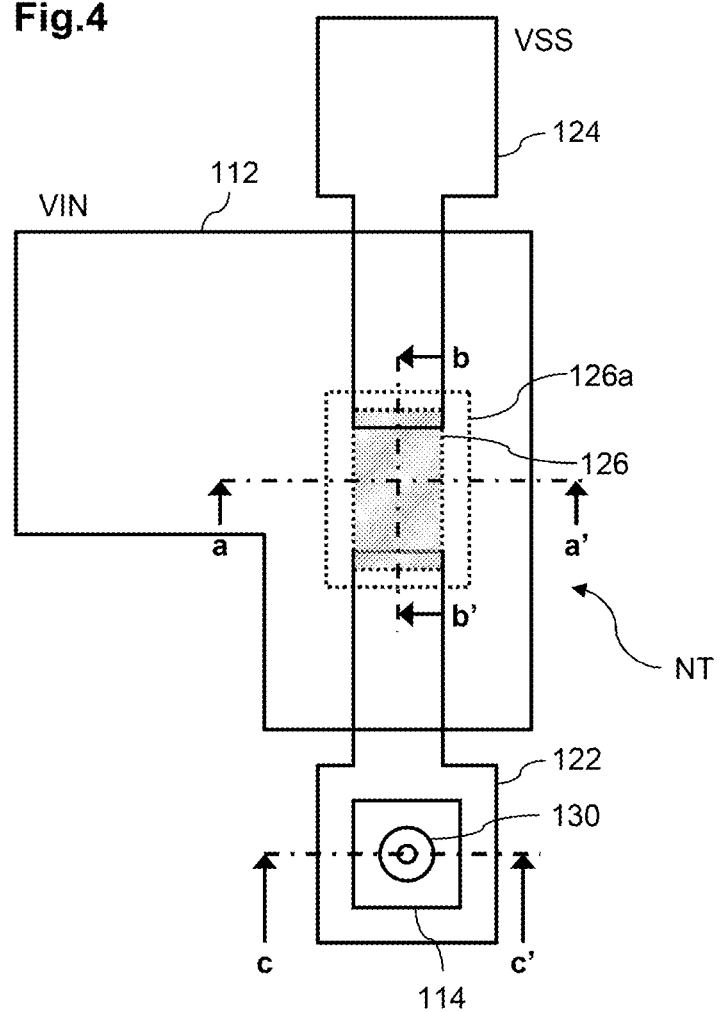

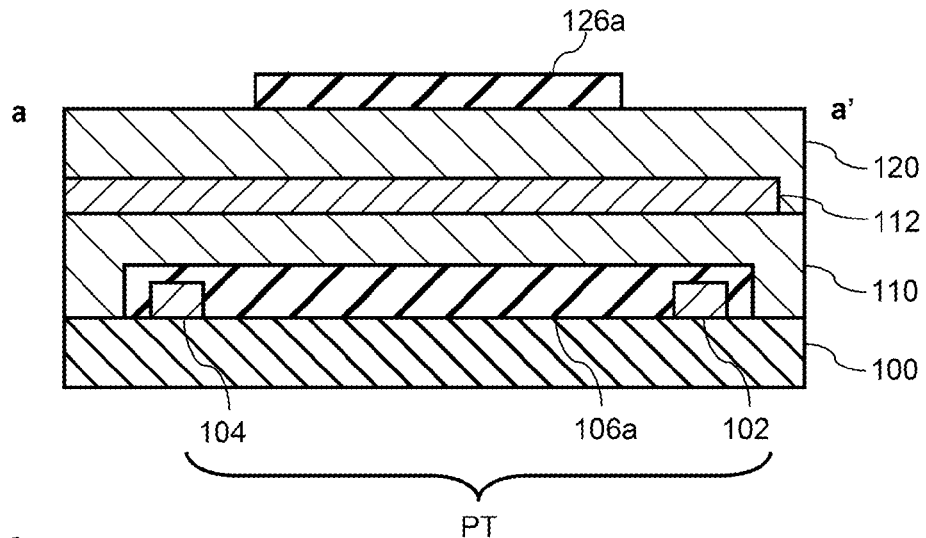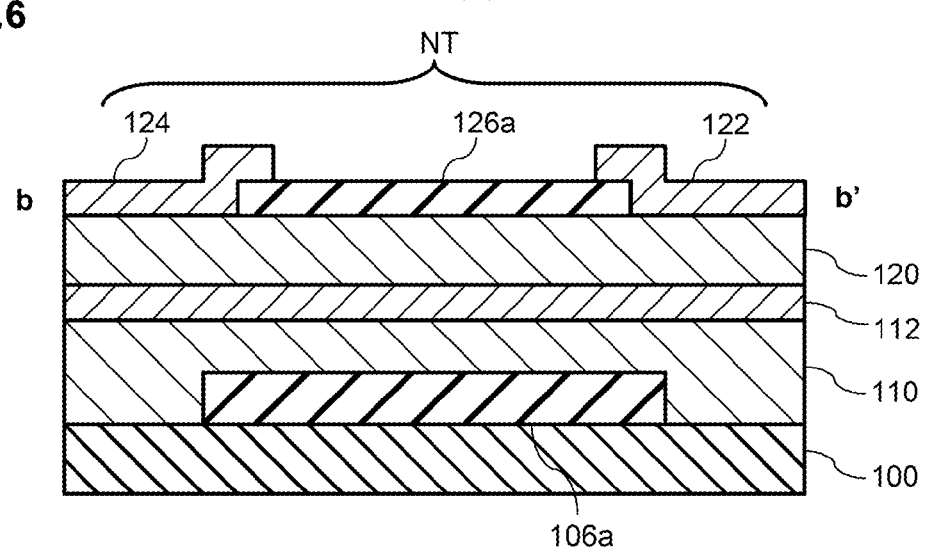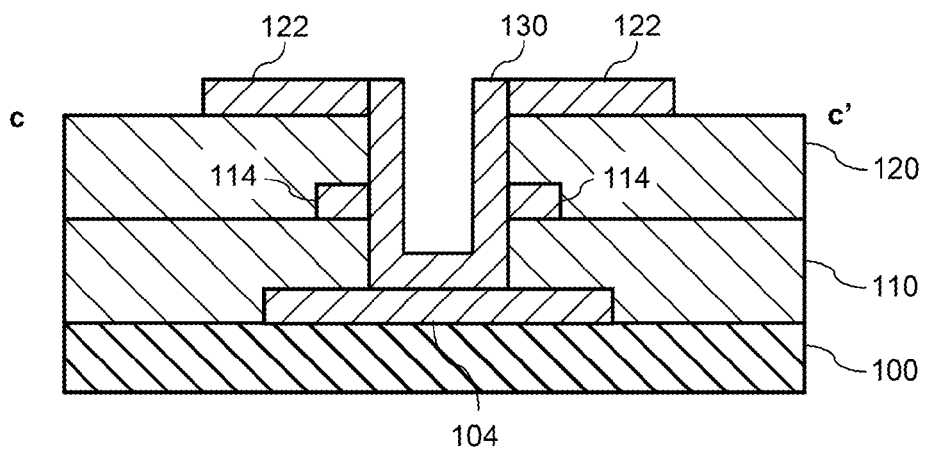

SEMICONDUCTOR DEVICE AND ELECTRONIC APPARATUS

BACKGROUND

1. Technical Field

The present invention relates to a semiconductor device and an electronic apparatus including the semiconductor device, and more particularly to a semiconductor device and an electronic apparatus including an organic transistor and an inorganic transistor.

2. Description of the Related Art

Recently, research and development has been made for an organic transistor and an inorganic transistor in which a plastic substrate or the like is used and which can be manufactured by a low-temperature process.

The organic transistor is characterized in that organic semiconductor materials used to form its semiconductor region usually have characteristics of p-type semiconductor. Due to these characteristics, there arises a problem that, in the organic transistor, while a p-type organic transistor operates excellently, an n-type organic transistor is slow in switching operation and unstable in operation.

On the other hand, the inorganic transistor is characterized in that inorganic semiconductor materials (inorganic oxide) used to form its semiconductor region usually have characteristics of n-type semiconductor. Due to these characteristics, in contrast to the organic transistor, there arises a problem that, in the inorganic transistor, while an n-type inorganic transistor operates excellently, a p-type inorganic transistor is slow in switching operation and unstable in operation.

Thus, in order to compensate the problem of the organic transistor with that of the inorganic transistor, there is a technique of combining a p-type organic transistor and an n-type inorganic transistor. More specifically, there is a technique of forming on a bendable substrate such as a plastic substrate, a CMOS circuit being a semiconductor device by use of a low-temperature process. This technique has been disclosed by Japanese Patent Laid-Open No. 2006-278621, National Publication of International Patent Application No. 2002-518844 and Japanese Patent Laid-Open No. 2004-228587.

In the semiconductor devices (CMOS circuit) described in Japanese Patent Laid-Open No. 2006-278621, National Publication of International Patent Application No. 2002-518844 and Japanese Patent Laid-Open No. 2004-228587, there is a problem that a larger circuit area is needed, raising the manufacturing cost. Further, in the semiconductor devices described in Japanese Patent Laid-Open No. 2006-278621, National Publication of International Patent Application No. 2002-518844 and Japanese Patent Laid-Open No. 2004-228587, there is also a problem that the organic transistor vulnerable to adverse effects of oxygen or moisture contained in surrounding gas is exposed on the circuit surface or formed in the vicinity of the circuit surface, so that the organic transistor is likely to deteriorate.

SUMMARY

An object of the present invention is to provide a semiconductor device allowing at least one of the above problems to be addressed.

To address the problems, a semiconductor device according to one aspect of the present invention includes: a substrate; a p-type organic transistor including an organic semiconductor layer arranged on or above the substrate; and an n-type inorganic transistor including an inorganic semiconductor layer arranged on or above the organic transistor, wherein a channel region of the inorganic transistor overlaps a channel region of the organic transistor at least partially in a plan view.

When the semiconductor device having the above structure is used, the semiconductor device having a smaller area can be provided, compared to the conventional semiconductor device having a structure in which the channel region of the inorganic transistor does not overlap the channel region of the organic transistor in a plan view.

Further, in the semiconductor device, at least the n-type inorganic transistor is arranged on the p-type organic transistor, and thus the effect of sealing the organic transistor rises compared to the conventional semiconductor device. More specifically, a member constituting the inorganic transistor is arranged above the organic semiconductor layer likely to deteriorate due to adverse effects of oxygen or moisture contained in surrounding gas, allowing suppression of deterioration of the organic transistor. Thus, the semiconductor device is suppressed from deteriorating and the semiconductor device with stable operation can be provided.

In the semiconductor device, it is preferable that an electrode functioning as a gate electrode of the organic transistor and also functioning as a gate electrode of the inorganic transistor is arranged above a gate insulating layer of the organic transistor and below a gate insulating layer of the inorganic transistor.

In the semiconductor device having the above structure, the gate electrode is shared by the organic transistor and the inorganic transistor, so that the number of layers in the semiconductor device can be reduced compared to a case where the gate electrodes are separately formed. Also, a CMOS circuit can be formed more readily.

It is preferable that: the organic transistor has a top gate structure and the inorganic transistor has a bottom gate structure; and a CMOS circuit is formed by the organic transistor and the inorganic transistor.

When the semiconductor device having the above structure is used, the CMOS circuit can be provided which is higher in the degree of integration and hardly affected by oxygen or moisture contained in surrounding gas.

In the semiconductor device, it is preferable that: any one of a source electrode and a drain electrode of the organic transistor is electrically connected, via a first electrical conductor arranged to extend from the gate insulating layer of the organic transistor to the gate insulating layer of the inorganic transistor, to any one of a source electrode and a drain electrode of the inorganic transistor; and a second electrical conductor electrically connected to the first electrical conductor is arranged between the gate insulating layer of the organic transistor and the gate insulating layer of the inorganic transistor.

In the semiconductor device having the above structure, the connection between any one of the source electrode and the drain electrode of the organic transistor and any one of the source electrode and the drain electrode of the inorganic transistor is made not only via the first electrical conductor but also via the second electrical conductor formed between the gate insulating layer 110 and the gate insulating layer 120. This structure allows provision of the semiconductor device which is lower in electrical resistance of the connection part and smaller in electrical loss. Thus, the semiconductor device can be provided which consumes less power and generates less heat. Further, occurrence of a loose connection caused by breaking of the connection part can also be reduced.

In the semiconductor device, it is preferable that: the gate electrode and any one of the source electrode and the drain electrode of the inorganic transistor are connected via the first electrical conductor arranged to extend from the gate insulating layer of the organic transistor to the gate insulating layer of the inorganic transistor; and the second electrical conductor electrically connected to the first electrical conductor is formed below the gate insulating layer of the organic transistor.

In the semiconductor device having the above structure, the connection between the gate electrode and any one of the source electrode and the drain electrode of the inorganic transistor is made not only via the first electrical conductor but also via the second electrical conductor formed below the gate insulating layer 110. This structure allows provision of the semiconductor device which is lower in electrical resistance of the connection part and smaller in electrical loss. Thus, the semiconductor device can be provided which consumes less power and generates less heat. Further, occurrence of a loose connection caused by breaking of the connection part can also be reduced.

It is preferable that both the source electrode and the drain electrode of the organic transistor have a comb-tooth shape, and some of the comb teeth of the one electrode are arranged in a manner disposed between the comb teeth of the other electrode.

The current driving capacity of a transistor is determined by factors such as the channel length, the channel width and the mobility of the transistor. Here, the mobility of an organic transistor is typically lower than that of an inorganic transistor, and thus the current driving capacity of the organic transistor is lower than that of the inorganic transistor. That is, in the semiconductor device according to the one aspect of the present invention, the current driving capacity of the p-type organic transistor is lower than that of the n-type inorganic transistor. In the semiconductor device, when there is a large difference in current driving capacity between the p-type transistor and the n-type transistor, the circuit operation may be unstable, which is not preferable. However, the current driving capacity can be, as described above, raised by varying the channel length or the like of the transistor.

In the semiconductor device according to one embodiment of the present invention, when the above structure is used, the channel width of the organic transistor can be enlarged, so that the current driving capacity of the p-type organic transistor is raised. As a result, the difference in current driving capacity between the p-type organic transistor and the n-type inorganic transistor can be lessened, so that the circuit operation is stabilized.

Also, it is preferable that: at least one of the source electrode and the drain electrode of the organic transistor is arranged in a region overlapping the channel region of the inorganic transistor in a plan view; and a region is arranged in which neither of the source electrode and the drain electrode of the organic transistor is arranged along a longitudinal direction of the channel of the inorganic transistor in an area extending from the end of the source electrode side of the inorganic transistor to the end of the drain electrode side of the inorganic transistor of the channel region of the inorganic transistor.

In the channel region of a transistor, when there is roughness in a direction (channel longitudinal direction) from the source electrode to the drain electrode, the channel region is partially thin or thick, and thus there may be variations in characteristics, and current flow may be unsmooth. As a result, the operation of the transistor may be unstable. As with the present invention, when the n-type inorganic transistor is arranged above the p-type organic transistor so that the channel region of the p-type organic transistor overlaps the channel region of the n-type inorganic transistor at least partially, roughness resulting from wiring and the like of electrodes formed below the channel region of the n-type inorganic transistor may be produced in the channel region, so that the operation of the inorganic transistor may be unstable.

In the semiconductor device according to the one aspect of the present invention, effects of roughness caused by the source electrode or the drain electrode of the organic transistor can be reduced. As a result, the operation of the inorganic transistor is stable, allowing provision of the semiconductor device with stable operation.

It is preferable that at least one of the source electrode and the drain electrode of the organic transistor is formed in the outside of the channel region of the inorganic transistor.

In the semiconductor device having the above structure, at least one of the source electrode and the drain electrode of the organic transistor is not formed below the channel region of the inorganic transistor. Thus, roughness can be prevented from being produced in the channel region of the inorganic transistor. As a result, the channel region being flatter can be formed, so that the operation of the inorganic transistor may be stable, allowing provision of the semiconductor device with stable operation.

It is more preferable that both the source electrode and the drain electrode of the organic transistor are formed in the outside of the channel region of the inorganic transistor in a plan view.

In this structure, the channel region being further flatter can be formed, allowing provision of the semiconductor device with a more stable operation.

It is preferable that the gate insulating layer of the inorganic transistor is formed of polymer.

In the semiconductor device having the above structure, the gate insulating layer of the inorganic transistor is formed of polymer more resistive to being broken by external force such as tensile stress or compressive stress than inorganic insulating layers, thus allowing provision of the semiconductor device more resistive to being broken.

The present invention includes an electronic apparatus including any of the above described semiconductor devices.

The electronic apparatus having the above structure has the features of any of the above described semiconductor devices; for example, the semiconductor device occupying a smaller area can be used, allowing provision of the electronic apparatus of a smaller size.

BRIEF DESCRIPTION OF THE DRAWINGS

FIG. 4 is a third plan view of the inverter circuit constituted of the CMOS circuit;

FIG. 5 is a cross-sectional view along the line a-a' in the CMOS circuit;

FIG. 6 is a cross-sectional view along the line b-b' in the CMOS circuit;

FIG. 7 is a cross-sectional view along the line c-c' in the CMOS circuit;

DESCRIPTION OF EXEMPLARY EMBODIMENTS

Figure 1:
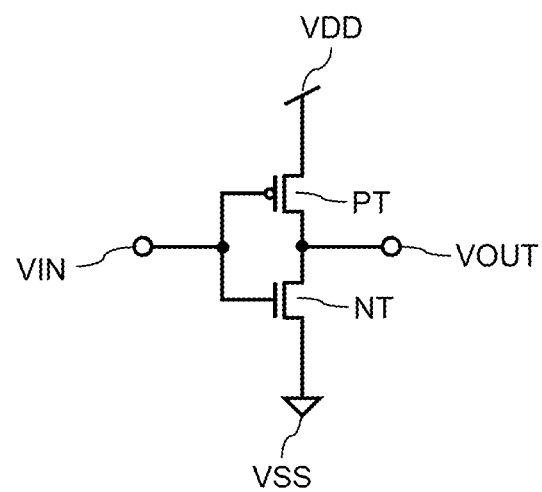
FIG. 1 is a circuit diagram illustrating an exemplary structure of an inverter circuit constituted of a CMOS circuit.

Embodiments of the present invention will be specifically described according to structures described below with reference to the drawings. The following embodiments are merely exemplary of the present invention, and are not be construed to limit the scope of the present invention. In the drawings, the same reference characters are applied to identical parts, and a repeated explanation thereof is omitted.

1. Definition
2. Embodiment 1
3. Method of manufacturing a semiconductor device according to the present embodiment
4. Embodiment 2
5. Exemplary structure of an electronic apparatus including the semiconductor device 1. Definition First, terms used in this specification are defined as follows:

"Channel length" denotes a length of the channel region in a plan view in a direction from the source electrode to the drain electrode formed in both ends of the channel region. In other words, the term denotes a length of the channel region in a direction in which current flows.

"Channel width" denotes a length of the channel region in a plan view in a direction orthogonal to the direction of the channel length.

Terms "on" or "above" and "below"; in a semiconductor device, a substrate is formed most "below", and when a material is formed in a manner overlying the substrate, it is said that the material is formed "on" or "above" the substrate. In the cross-sectional views of the semiconductor device, one drawn in an upward direction is said to be "on" or "above".

"CMOS circuit" denotes a semiconductor circuit including an n-type transistor and a p-type transistor; the semiconductor circuit is a semiconductor device.

2. Embodiment 1

Inverter Circuit Constituted of CMOS Circuit

The present embodiment will be described by taking as an illustrative example, an inverter circuit constituted of a CMOS circuit, which is a semiconductor device including an organic transistor and an inorganic transistor.

FIG. 1 is a circuit diagram illustrating an exemplary structure of an inverter circuit constituted of a CMOS circuit according to the present embodiment. Referring to FIG. 1, the inverter circuit according to the present embodiment includes a p-type organic transistor PT and an n-type inorganic transistor NT. In the p-type organic transistor PT, a gate electrode thereof is connected to an input terminal VIN, a source electrode thereof to a power supply potential VDD, and a drain electrode thereof to an output terminal VOUT. In the n-type inorganic transistor NT, a gate electrode thereof is connected to an input terminal VIN, a drain electrode thereof to an output terminal VOUT, and a source electrode thereof to a ground potential VSS. The inverter circuit having the above structure can operate so that a potential level of a signal supplied from the input terminal VIN and having the potential level of the power supply potential VDD (Hi level) or the ground potential VSS (Lo level) is inverted and outputted from the output terminal VOUT.

Plan View of CMOS Circuit

Figure 2:
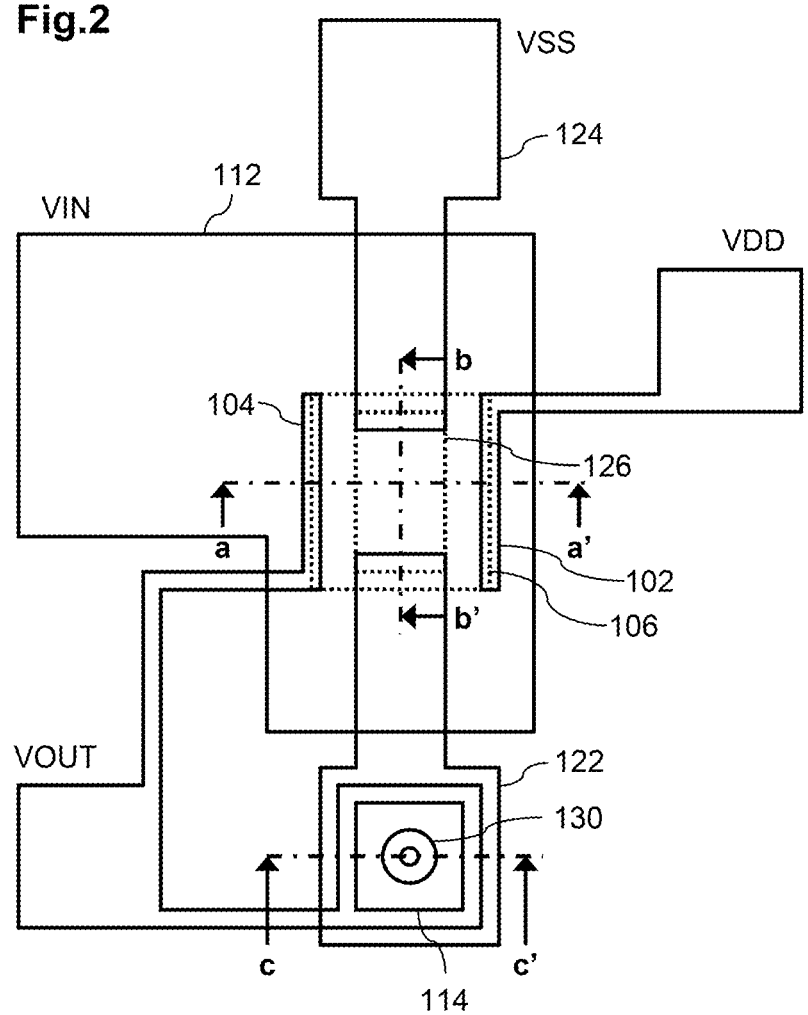
FIG. 2 is a first plan view of the inverter circuit constituted of the CMOS circuit.

FIG. 2 is a plan view of the inverter circuit constituted of the CMOS circuit according to the present embodiment. Referring to FIG. 2, constituent parts which are hidden by another constituent part so that they cannot be seen when the CMOS circuit is observed from above, are also depicted by solid lines. The same applies to FIGS. 3, 4, and 9 to 11.

The p-type organic transistor PT includes, as illustrated in FIG. 2, a source electrode 102, a drain electrode 104, a gate insulating layer 110 (not illustrated) and an organic semiconductor layer 106a (not illustrated). The n-type inorganic transistor NT includes a source electrode 124, a drain electrode 122, a gate insulating layer 120 (not illustrated) and an inorganic semiconductor layer 126a (not illustrated). In the organic semiconductor layer 106a, a region between the source electrode 102 and the drain electrode 104 corresponds to a channel region 106. In the inorganic semiconductor layer 126a, a region between the source electrode 124 and the drain electrode 122 corresponds to a channel region 126. The CMOS circuit includes the source electrode 102 of the p-type organic transistor PT, the drain electrode 104 of the p-type organic transistor PT, the channel region 106 of the p-type organic transistor PT, and a gate electrode 112. The CMOS circuit further includes the drain electrode 122 of the n-type inorganic transistor NT, the source electrode 124 of the n-type inorganic transistor NT, and the channel region 126 of the n-type inorganic transistor NT. The CMOS circuit further includes an electrical conductor 114 and an interlayer contact 130. The gate electrode 112 is shared by the p-type organic transistor PT and the n-type inorganic transistor NT. The p-type organic transistor PT has a top gate structure in which the gate electrode 112 is arranged on the gate insulating layer 110; and the n-type inorganic transistor NT has a bottom gate structure in which the gate electrode 112 is arranged under the gate insulating layer 120. The channel region 106 of the p-type organic transistor PT overlaps the channel region 126 of the n-type inorganic transistor NT in a plan view.

The gate electrode 112 is, as illustrated in FIG. 2, connected to the input terminal VIN; the source electrode 102 of the p-type organic transistor PT is connected to the power supply potential VDD; and the drain electrode 104 of the p-type organic transistor PT is connected to the output terminal VOUT. The source electrode 124 of the n-type inorganic transistor NT is connected to the ground potential VSS. The drain electrode 122 of the n-type inorganic transistor NT is connected via the interlayer contact 130 and the electrical conductor 114 to the drain electrode 104 of the p-type organic transistor PT.

Cross-sectional views along the lines a-a', b-b' and c-c' in FIG. 2 will be described later.

Figure 3:
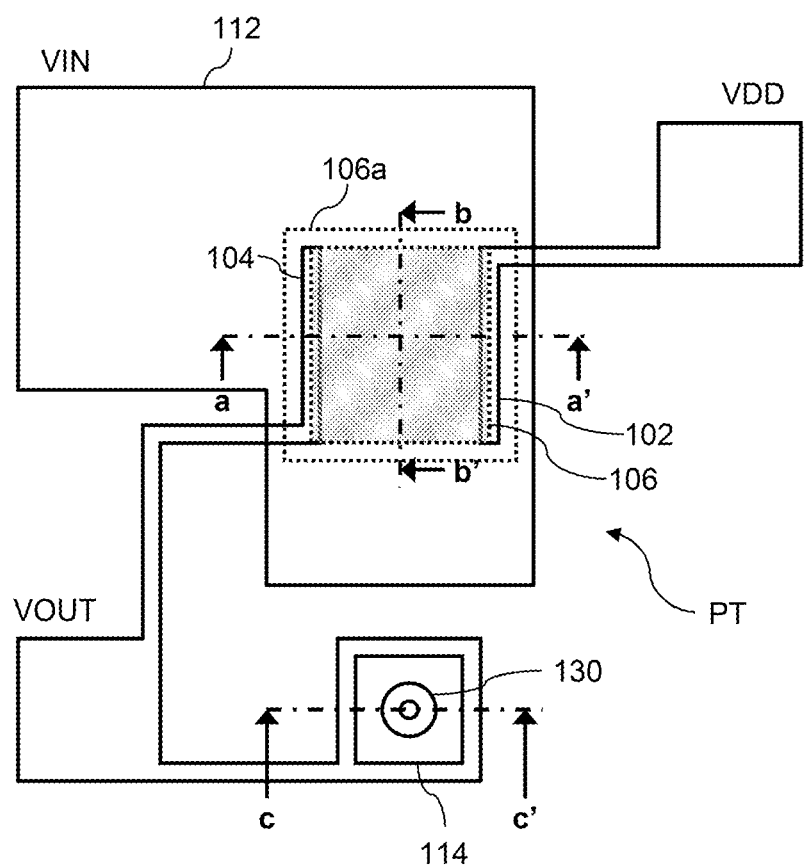
FIG. 3 is a second plan view of the inverter circuit constituted of the CMOS circuit.

FIG. 3 is a plan view illustrating the arrangement of the organic semiconductor layer 106a, the source electrode 102 the drain electrode 104, and the channel region 106 of the p-type organic transistor PT formed on the substrate, and the gate electrode 112 formed on the p-type organic transistor PT; the above constituent parts are included in the CMOS circuit according to the present embodiment.

FIG. 4 is a plan view illustrating the arrangement of the gate electrode 112 formed above the channel region 106 of the p-type organic transistor PT and below the channel region 126 of the n-type inorganic transistor NT, and the arrangement of the inorganic semiconductor layer 126a, the drain electrode 122, the source electrode 124 and the channel region 126 of the n-type inorganic transistor NT; the above constituent parts are included in the CMOS circuit according to the present embodiment.

Cross-Sectional View Along Line a-a' in CMOS Circuit

FIG. 5 is a cross-sectional view along the line a-a' in the CMOS circuit according to the present embodiment.

Substrate 100

The CMOS circuit is, as illustrated in FIG. 5, formed above a substrate 100. Various materials may be used for the substrate 100. Examples of these substrate materials include glass, silicon, metal such as aluminum or stainless, semiconductor such as gallium arsenide (GaAs), and plastic. The p-type organic transistor PT and the n-type inorganic transistor NT according to the present embodiment are transistors capable of being manufactured by a low-temperature process of 200° C. or less; thus a plastic substrate is preferably used which is characterized by lightweight, high flexibility and low cost. As the plastic substrate according to the present embodiment, either of thermoplastic resin and thermoset resin may be used. Examples of the plastic substrate materials include polyolefin such as polyethylene, polypropylene, ethylene-propylene copolymer or ethylene-vinyl acetate copolymer (EVA), cyclic polyolefin, denatured polyolefin, polyvinyl chloride, polyvinyl vinylidene, polystyrene, polyamide, polyimide, polyamide-imide, polycarbonate, poly(4-methyl-pentene-1), ionomer, acrylic resin, polymethyl methacrylate, acrylic-styrene copolymer (AS resin), butadiene-styrene copolymer, polyo-copolymer (EVOH), polyester such as polyethylene terephthalate, polybutylene terephthalate, polyethylene naphthalate or precyclo hexane terephthalate (PCT), polyether, polyetherketone, polyetheretherketone, polyetherimide, polyacetal, polyphenyleneoxide, modified polyphenyleneoxide, polyarylate, aromatic polyester (liquid crystal polymer), polytetrafluoroethylene, polyvinylidene fluoride or another type of fluorocarbon resin, thermoplastic elastomer such as styrene, polyolefin, polyvinyl chloride, polyurethane, fluororubber or chlorinated polyethylene, epoxy resin, phenol resin, urea resin, melamine resin, unsaturated polyester, silicone resin, polyurethane, or copolymer mainly composed of these, blend, or polymer alloy. A layered product obtained by stacking two or more of the above materials may also be used as the plastic substrate.

Source Electrode 102 and Drain Electrode 104 of P-Type Organic Transistor PT

The source electrode 102 and the drain electrode 104 of the p-type organic transistor PT composed of a conductive material are formed on the substrate 100. Examples of the conductive material include Cr, Al, Ta, Mo, Nb, Cu, Ag, Au, Pt, Pd, In, Ni, Nd and metal alloy of these. A conductive oxide such as $InO_2$, $SnO_2$ or ITO, or a conductive polymer such as polyaniline, polypyrrole, polythiophene or polyacetylene may also be used. A material may also be used which is obtained by adding to the above conductive polymer, a dopant made of acid such as hydrochloric acid, sulfuric acid or sulfonic acid, Lewis acid such as $PF_6$, $AsF_6$ or $FeCl_3$, halogen atoms such as iodine, or metal atoms such as sodium or potassium. Further, a conductive composite material obtained by dispersing carbon black or metal particles may also be used. Here, in order to prevent the source electrode 102 and the drain electrode 104 from affecting the flatness of layers formed thereabove, the source electrode 102 and the drain electrode 104 are preferably formed equal to or less than 100 nm in thickness, and more preferably formed equal to or less than 50 nm in thickness.

Channel Region 106 of P-Type Organic Transistor PT

The organic semiconductor layer 106a is arranged on the substrate 100; of the organic semiconductor layer 106a, a region between the source electrode 102 and the drain electrode 104 corresponds to the channel region 106 of the p-type organic transistor PT. As the material of the organic semiconductor layer 106a, a polymer organic semiconductor material may be used including poly(3-alkylthiophene), poly(3-hexylthiophene) (P3HT), poly(3-octylthiophene), poly(2,5-thienylene vinylene) (PTV), poly(para-phenylene vinylene) (PPV), poly(9,9-dioctylfluorene) (PFO), poly(9,9-dioctylfluorene-corbis-N,N'-(4-methoxyphenyl)-bis-N,N'-phenyl-1,4-phenylenediamine) (PFMO), poly(9,9-dioctylfluorene-co-benzothiadiazole) (BT), fluorene-triarylamine copolymer, triarylamine-based polymer, and poly(9,9-dioctylfluorene-co-dithiphene) (F8T2). $C_{60}$, metal phthalocyanine or substituted derivative of these may also be used. An acene molecular material such as anthracene, tetracene, pentacene or hexacene, or α-oligothiophene (more specifically, low-molecular organic semiconductor such as quarterthiophene (4T), sexithiophene (6T) or octathiophene) may also be used. Further, a material obtained by mixing two or more of the above materials may also be used.

Gate Insulating Layer 110

Further formed above the substrate 100 is the gate insulating layer 110 composed of an insulating material, so that the source electrode 102 and the drain electrode 104 of the p-type organic transistor PT and the organic semiconductor layer 106a are covered by the gate insulating layer 110. As the insulating material, an organic material or an inorganic material may be used. Examples of the organic material constituting the gate insulating layer 110 include polyester, polycarbonate, polyvinylalcohol, polyacetal, polyarylate, polyamide, polyamideimide, polyolefin, polyetherimide, polyphenylene ether, polyphenylene sulfide, polyethersulfone, polyetherketone, polyphthalamide, polyether nitrile, polyethersulfone, polybenzimidazole, polycarbodiimide, polysiloxane, polymethyl methacrylate, polymethacrylamide, nitrile rubber, acrylic rubber, polyethylene tetrafluoride, epoxy resin, urethane resin, phenol resin, melamine resin, urea resin, polybutene, polypentene, polybutadiene, butyl rubber, polystyrene, and copolymer of these, and parylene film. Examples of the inorganic material include a metal oxide such as silicon oxide, silicon nitride, aluminum oxide or tantalum oxide, a metal composite oxide such as barium titanate strontium or zirconium lead titanate, and silicon-based insulating film composed of a coated film of benzocyclobutene, polysilazane compound or polysilane compound. Further, a material obtained by combining two or more of these organic materials and inorganic materials may also be used.

Gate Electrode 112

The gate electrode 112 composed of a conductive material is formed on the gate insulating layer 110. The conductive material constituting the gate electrode 112 may be a material similar to that of the source electrode 102 and the drain electrode 104 of the p-type organic transistor PT.

Gate Insulating Layer 120

Further formed on or above the gate insulating layer 110 is the gate insulating layer 120 composed of an insulating material to cover the gate electrode 112. As the material of the gate insulating layer 120, an insulating material similar to that of the gate insulating layer 110 may be used.

Channel Region 126 of N-Type Inorganic Transistor NT

The inorganic semiconductor layer 126a is arranged on the gate insulating layer 120; a region between the source electrode 124 and the drain electrode 122 of the inorganic semiconductor layer 126a corresponds to the channel region 126 of the n-type inorganic transistor NT. The inorganic semiconductor layer 126a is composed of a compound semiconductor or oxide semiconductor, and is more preferably composed of an oxide semiconductor. Examples of oxide semiconductor constituting the inorganic semiconductor layer 126a include zinc oxide (ZnO), InGaO$_3$ (ZnO)$_5$, magnesium zinc oxide (Mg$_X$Zn$_{1-X}$O), cadmium zinc oxide (Cd$_X$Zn$_{1-X}$O), cadmium oxide (CdO), In—Ga—Zn—O-based amorphous oxide semiconductor (a-IGZO), Sn—In—Zn oxide, In—Zn—Ga—Mg oxide, In oxide, In—Sn oxide, In—Ga oxide, In—Zn oxide, Zn—Ga oxide and Sn—In—Zn oxide.

Cross-Sectional View Along Line b-b' in CMOS Circuit

FIG. 6 is a cross-sectional view along the line b-b' in the CMOS circuit according to the present embodiment. Referring to FIG. 6, the structure of the substrate 100, the organic semiconductor layer 106a, the gate insulating layer 110, the gate electrode 112, the gate insulating layer 120 and the inorganic semiconductor layer 126a is similar to that of FIG. 5 above described, and hence an explanation thereof is omitted here.

Drain Electrode 122 and Source Electrode 124 of N-Type Inorganic Transistor NT

Referring to FIG. 6, the drain electrode 122 and the source electrode 124 of the n-type inorganic transistor NT are formed on the gate insulating layer 120. The drain electrode 122 and the source electrode 124 of the n-type inorganic transistor NT are composed of a conductive material used for the source electrode 102 and the drain electrode 104 of the p-type organic transistor PT.

Cross-Sectional View Along Line c-c' in CMOS Circuit

FIG. 7 is a cross-sectional view along the line c-c' in the CMOS circuit according to the present embodiment. Referring to FIG. 7, the structure of the substrate 100, and the structure of the drain electrode 104, the gate insulating layer 110 and the gate insulating layer 120 of the p-type organic transistor PT, and the structure of the drain electrode 122 of the n-type inorganic transistor NT are similar to those of FIGS. 5 and 6 above described, and hence an explanation thereof is omitted here.

Interlayer Contact 130

Referring to FIG. 7, arranged on the drain electrode 104 of the p-type organic transistor PT is the interlayer contact 130 extending through the gate insulating layer 110 and the gate insulating layer 120; and the drain electrode 104 of the p-type organic transistor PT and the drain electrode 122 of the n-type inorganic transistor NT are electrically connected via the interlayer contact 130. The interlayer contact 130 is composed of a conductive material similar to that of the source electrode 102 and the drain electrode 104 of the p-type organic transistor PT.

Electrical Conductor 114

The electrical conductor 114 composed of a conductive material is formed on the gate insulating layer 110 to surround the interlayer contact 130. The electrical conductor 114 is electrically connected to the interlayer contact 130. As the conductive material constituting the electrical conductor 114, a material similar to that of the p-type organic transistor PT is used.

In the semiconductor device according to the present embodiment, the interlayer contact 130 and the electrical conductor 114 are, as described above, formed so that layers electrically separated by the gate insulating layers 110 and 120 can be connected. In the above embodiment, the drain electrode 104 of the p-type organic transistor PT and the drain electrode 122 of the n-type inorganic transistor NT are connected, but the present invention is not limited to this embodiment. More specifically, any two of the source electrode 102 or the drain electrode 104 of the p-type organic transistor PT, and the source electrode 124 and the drain electrode 122 of the n-type inorganic transistor NT, and the gate electrode 112 may be electrically connected using the interlayer contact 130 and the electrical conductor 114.

Figure 8:
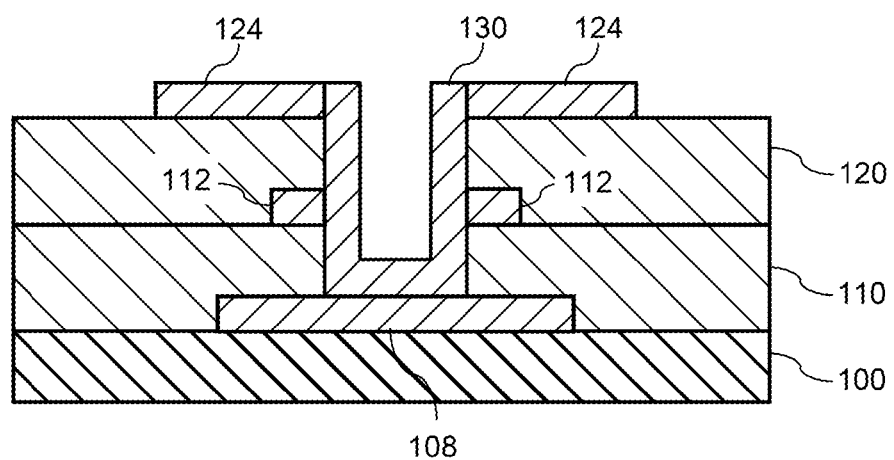
FIG. 8 is a view illustrating an exemplary structure of a semiconductor device in which an interlayer contact is used.

For example, FIG. 8 illustrates an exemplary structure in which the source electrode 124 of the n-type inorganic transistor NT and the gate electrode 112 are electrically connected. An electrical conductor 108 is, as illustrated in FIG. 8, formed on the substrate 100. Arranged above the electrical conductor 108 is the interlayer contact 130 extending through the gate insulating layer 110 and the gate insulating layer 120; and the source electrode 124 of the n-type inorganic transistor NT and the gate electrode 112 are electrically connected via the interlayer contact 130.

SUMMARY

The CMOS circuit being the semiconductor device according to the present embodiment includes (a) the substrate 100, (b) the p-type organic transistor PT including the organic semiconductor layer 106a, and (c) the n-type inorganic transistor NT including the inorganic semiconductor layer 126a arranged on or above the p-type organic transistor PT. Further, the channel region 126 of the n-type inorganic transistor NT overlaps the channel region 106 of the p-type organic transistor PT at least partially in a plan view.

When the semiconductor device having the above structure is used, the semiconductor device can be provided which is smaller in area than a conventional semiconductor device having a structure in which the channel region of the inorganic transistor does not overlap the channel region of the organic transistor in a plan view.

Further, in the semiconductor device, at least the n-type inorganic transistor NT is arranged above the p-type organic transistor PT and thus the effect of sealing the p-type organic transistor PT rises compared to the conventional semiconductor device. More specifically, a member constituting the n-type inorganic transistor NT is arranged above the organic semiconductor layer 106a likely to deteriorate due to adverse effects of oxygen or moisture contained in surrounding gas, thus allowing suppression of deterioration of the p-type organic transistor PT. Thus, the semiconductor device is suppressed from deteriorating and the semiconductor device with stable operation can be provided.

The gate insulating layer 120 is preferably arranged in a manner covering the organic semiconductor layer 106a. When this structure is used, the gate insulating layer 120 is arranged all over the organic semiconductor layer 106a, so that higher sealing effects are achieved.

Also, the gate insulating layer 110 and the like are formed on or above the organic semiconductor layer 106a, and thus the gate insulating layer 110 and the like and the gate insulating layer 120 are arranged on or above the organic semiconductor layer 106a, so that higher sealing effects are achieved.

The gate insulating layer 110 is preferably arranged in a manner covering the organic semiconductor layer 106a. When this structure is used, the gate insulating layer 110 is arranged all over the organic semiconductor layer 106a, so that higher sealing effects are achieved.

In the semiconductor device according to the present embodiment, an electrode functioning as the gate electrode 112 of the p-type organic transistor PT and as the gate electrode 112 of the n-type inorganic transistor NT is preferably formed between the channel region 106 of the p-type organic transistor PT and the channel region 126 of the n-type inorganic transistor NT.

When the semiconductor device having this structure is used, the gate electrode 112 can be shared by the p-type organic transistor PT and the n-type inorganic transistor NT. In this case, the number of layers in the semiconductor device is reduced, compared to a case where the gate electrodes are separately formed. As a result, the process of manufacturing the semiconductor device can be shortened. Further, the semiconductor device of lower cost is provided. Also, the forming of the CMOS circuit is facilitated.

As described in the present embodiment, the following structure is preferably used. That is, the source electrode 102 and the drain electrode 104 of the p-type organic transistor PT are formed below the gate insulating layer 110; and the gate electrode 112 is formed between the gate insulating layer 110 and the gate insulating layer 120; and the source electrode 124 and the drain electrode 122 of the n-type inorganic transistor NT are formed on or above the gate insulating layer 120; and any one of the source electrode 102 or the drain electrode 104 of the p-type organic transistor PT and any one of the source electrode 124 or the drain electrode 122 of the n-type inorganic transistor NT are connected via the interlayer contact 130 formed in a region from the gate insulating layer 110 to the gate insulating layer 120 and acting as the first electrical conductor. Further, the electrical conductor 114 electrically connected to the interlayer contact 130 and acting as the second electrical conductor is formed between the gate insulating layer 110 and the gate insulating layer 120.

In the semiconductor device having the above structure, the connection between any one of the source electrode 102 and the drain electrode 104 of the p-type organic transistor PT and any one of the source electrode 124 and the drain electrode 122 of the n-type inorganic transistor NT is made not only via the interlayer contact 130 but also via the electrical conductor 114 formed between the gate insulating layer 110 and the gate insulating layer 120. This structure allows provision of the semiconductor device which is lower in electrical resistance of the connection part and smaller in electrical loss. Thus, the semiconductor device can be provided which consumes less power and generates less heat. Further, occurrence of a loose connection caused by breaking of the connection part in the interlayer contact 130 or the like can also be reduced.

As described in the present embodiment, the following structure is preferably used. That is, the source electrode 102 and the drain electrode 104 of the p-type organic transistor PT are formed below the gate insulating layer 110; and the gate electrode 112 is formed between the gate insulating layer 110 and the gate insulating layer 120; and the source electrode 124 and the drain electrode 122 of the n-type inorganic transistor NT are formed on or above the gate insulating layer 120; and the gate electrode 112 and any one of the source electrode 124 and the drain electrode 122 of the n-type inorganic transistor NT are connected via the interlayer contact 130 formed in a region from the gate insulating layer 110 to the gate insulating layer 120. Further, the electrical conductor 114 electrically connected to the interlayer contact 130 and acting as the second electrical conductor is formed on the gate insulating layer 110.

In the semiconductor device having the above structure, the connection between the gate electrode 112 and any one of the source electrode 124 and the drain electrode 122 of the n-type inorganic transistor NT is made not only via the interlayer contact 130 but also via the electrical conductor 114 formed below the gate insulating layer 110. This structure allows provision of the semiconductor device which is lower in electrical resistance of the connection part and smaller in electrical loss. Thus, the semiconductor device can be provided which consumes less power and generates less heat.

Further, occurrence of a loose connection caused by breaking of the connection part in the interlayer contact 130 or the like can also be reduced.

In a plan view, at least one of the source electrode 102 and the drain electrode 104 of the p-type organic transistor PT is preferably formed in the outside of the channel region 126 of the n-type inorganic transistor NT.

In the semiconductor device having the above structure, at least one of the source electrode 102 and the drain electrode 104 of the p-type organic transistor PT is not formed below the channel region 126 of the n-type inorganic transistor NT. As a result, roughness is prevented from being produced in the channel region 126 of the n-type inorganic transistor NT. Thus, the channel region 126 being flatter can be formed, so that the operation of the n-type inorganic transistor NT is stable, allowing provision of the semiconductor device with stable operation.

In a plan view, both the source electrode 102 and the drain electrode 104 of the p-type organic transistor PT are preferably formed in the outside of the channel region 126 of the n-type inorganic transistor NT.

When this structure is used, the channel region 126 being further flatter can be formed, allowing provision of the semiconductor device with a more stable operation.

Also, the gate insulating layer 120 of the n-type inorganic transistor NT is preferably formed of polymer.

When the semiconductor device having the above structure is used, the gate insulating layer 120 of the n-type inorganic transistor NT is formed of polymer hardly broken by external force, allowing provision of the semiconductor device hardly broken.

Supplement

According to the present embodiment, the source electrode 102, the drain electrode 104, the gate electrode 112 and the electrical conductor 114 of the p-type organic transistor PT, and the drain electrode 122 and the source electrode 124 of the n-type inorganic transistor NT, and the interlayer contact 130 are composed of a conductive material, but may be composed of a conductive material different from each other. The gate insulating layers 110 and 120 may also be composed of a conductive material different from each other.

The present embodiment has been described by taking as an example, the inverter circuit. However, the present invention can be applied to various semiconductor circuits within the scope of the purpose of the present invention, including a multiple-input NAND circuit, a multiple-input NOR circuit, a shift register circuit, a latch circuit, a level shifter circuit, a buffer circuit and a current mirror circuit.

The p-type organic transistor PT according to the present embodiment has been described by taking as an example, a bottom contact structure in which the source electrode 102 and the drain electrode 104 are arranged under the organic semiconductor layer 106*a*. However, the present invention is not limited thereto. That is, the p-type organic transistor PT may be used which has a top contact structure in which the source electrode 102 and the drain electrode 104 are arranged on the organic semiconductor layer 106*a*.

Similarly, the n-type inorganic transistor NT according to the present embodiment has been described by taking as an example, a top contact structure. However, the n-type inorganic transistor NT may be used which has a bottom contact structure.

3. Method of Manufacturing Semiconductor Device According to the Present Embodiment The method of manufacturing the semiconductor device according to the present embodiment will now be described briefly with reference to FIGS. 5 to 7.

(1) Substrate

First, a substrate used for forming the organic transistor is prepared.

(2) Process of Forming Source Electrode 102 and Drain Electrode 104 of P-Type Organic Transistor PT Subsequently, the source electrode 102 and the drain electrode 104 of the p-type organic transistor PT are, as illustrated in FIGS. 5 and 6, formed on the substrate 100.

To form the source electrode 102 and the drain electrode 104, for example, a method may be used in which, after a conductor layer has been formed all over the substrate, unwanted parts are removed by photo etching or the like. Alternatively, a conductor may be vapor-deposited on the substrate through a metal-through mask having a hole of a predetermined shape to form the source electrode 102 and the drain electrode 104. Further, when a polymer mixture containing a conductive particle such as metal minute particle or graphite is used as a conductive material for the source electrode 102 and the drain electrode 104, solution patterning by droplet discharging may be used. When this droplet discharging is used, the electrodes can be formed more readily and at lower cost.

(3) Process of Forming Channel Region 106 of P-Type Organic Transistor PT

Subsequently, the organic semiconductor layer 106a is, as illustrated in FIGS. 5 and 6, formed on the substrate 100. Of the organic semiconductor layer 106a, a region between the source electrode 102 and the drain electrode 104 corresponds to the channel region 106. To form the organic semiconductor layer 106a, a vacuum evaporation method, molecular beam epitaxy, CDV method, sputtering method, plasma polymerization method, electric-field polymerization method, chemical polymerization method, ion plating method, spin coating method, casting method, pulling method, Langmuir-Blodgett method, spraying method, droplet discharging method, roll coating method, bar coating method, dispensing method, silk screen method or the like may be used. However, the present invention is not limited thereto. Particularly, forming of the organic semiconductor layer 106a by the droplet discharging method spin coating method, dip coating method, roll coating method or bar coating method is preferable, because thin film can be formed readily and precisely using organic semiconductor solution.

(4) Process of Forming Gate Insulating Layer 110

Subsequently, the gate insulating layer 110 is, as illustrated in FIGS. 5 to 7, formed.

In forming the gate insulating layer 110 by use of an organic material, a method may be used in which after a solution containing an organic material or its precursor is coated to cover the gate insulating layer 110, posttreatment (for example, heating, irradiation of infra red ray, or application of ultrasonic wave) is applied to the coating film as required. As the method of coating a solution containing an organic material or its precursor onto the gate insulating layer 110, a coating method such as spin coating method or dip coating method, or a printing method such as droplet discharging method or screening method may be used.

When the gate insulating layer 110 is formed using an inorganic material, a thermal oxidation method, CVD method or SOG method may be used, for example.

(5) Process of Forming Contact Hole

A contact hole used to electrically connect the gate electrode 112 with the source electrode 102 and the drain electrode 104 of the p-type organic transistor PT, is formed as required. As the method of forming the contact hole, wet etching, dry etching or the like may be used. The wet etching is performed using acid, base, aromatic solvent, ketonic solvent, alcoholic solvent or organic solvent. Examples of the acid used for the wet etching include fluorinated acid, nitric acid, hydrochloric acid and sulfuric acid. Examples of the base used for the wet etching include sodium hydrate, potassium hydrate, calcium hydrate and ammonium. The dry etching is performed using oxygen plasma, argon plasma or $CF_4$ plasma.

A laser abrasion method may also be used, using a semiconductor laser, excimer laser, laser for cutting operations, ruby laser, glass laser, YAG laser or carbon dioxide laser. As the semiconductor laser, GaAlAs, InGaAsP or the like is used. As the excimer laser, ArF, KrF, XeCl, XeF or the like is used. As the laser for cutting operations, Ar ion laser or the like is used.

A mechanical processing method or the like may also be used, using a press apparatus dicing saw, diamond blade or diamond needle.

This process may also be used in forming the interlayer contact 130 formed after the gate insulating layer 120 has been formed.

(6) Process of Forming Gate Electrode 112 and Electrical Conductor 114

Subsequently, the gate electrode 112 and the electrical conductor 114 are, as illustrated in FIGS. 5 to 7, formed. In this process, a method may be used which is similar to the process of forming the source electrode 102 and the drain electrode 104 of the p-type organic transistor PT similarly composed of a conductive material.

Here, after the contact hole has been formed, in this process, the source electrode 102 or the drain electrode 104 of the p-type organic transistor PT may be electrically connected to the gate electrode 112 so that electrical conduction therebetween is made. Alternatively, the part in which the contact hole has been formed may be coated with a polymer mixture containing conductive particles such as metal minute particles, using a solution patterning method such as a droplet discharging method, whereby the conducting part is formed. This method allows prevention of lowered yield caused by a conduction problem.

(7) Process of Forming Gate Insulating Layer 120

Subsequently, the gate insulating layer 120 is, as illustrated in FIGS. 5 to 7, formed. In this process, a method may be used which is similar to the process of forming the gate insulating layer 110.

(8) Process of Forming Channel Region 126 of N-Type Inorganic Transistor NT

Subsequently, the inorganic semiconductor layer 126a is, as illustrated in FIGS. 5 and 6, formed above the gate insulating layer 120. Of the inorganic semiconductor layer 126a, a region between the source electrode 124 and the drain electrode 122 corresponds to the channel region 126.
The inorganic semiconductor layer 126a may be formed using a conventional method such as sputtering or laser abrasion.

(9) Process of Forming Source Electrode 124 and Drain Electrode 122 of N-Type Inorganic Transistor NT Subsequently, the source electrode 124 and the drain electrode 122 of the n-type inorganic transistor NT are, as illustrated in FIGS. 5 and 6, formed. In this process, a method may be used which is similar to the process of forming the source electrode 102 and the drain electrode 104 of the p-type organic transistor PT.

(10) Process of Forming Interlayer Contact 130

Subsequently, the interlayer contact 130 is, as illustrated in FIG. 7, formed which is used to electrically connect any two of the source electrode 102, the drain electrode 104 and the gate electrode 112 of the p-type organic transistor PT, and the source electrode 124 and the drain electrode 122 of the n-type inorganic transistor NT. The interlayer contact 130 may be formed by a method similar to the process of forming the contact hole. In the present embodiment, an example is illustrated in which the drain electrode 104 of the p-type organic transistor PT is connected to the drain electrode 122 of the n-type inorganic transistor NT.

(11) Process of Forming Sealing Layer

Further, a sealing layer (not illustrated) may be formed, as required, which is used to protect the semiconductor device from moisture, oxygen and light. The sealing layer may be formed using inorganic oxide such as silicon oxide, aluminum oxide or tantalum oxide, inorganic nitride such as silicon nitride, or insulating organic polymer such as polyvinyl phenol (PVP), polymethyl methacrylate (PMMA), polyethylene, parylene film or UV cured resin, or multilayer film composed of these materials.

4. Embodiment 2

The present embodiment will be described, similarly to Embodiment 1, taking as an example, an inverter circuit constituted of a CMOS circuit, being the semiconductor device including an organic transistor and an inorganic transistor. However, this embodiment 2 is different from Embodiment 1 in the configuration of the source electrode 102, the drain electrode 104 and the channel region 106 of the p-type organic transistor PT. Thus this difference will be mainly described.

Plan View of CMOS Circuit

Figure 9:
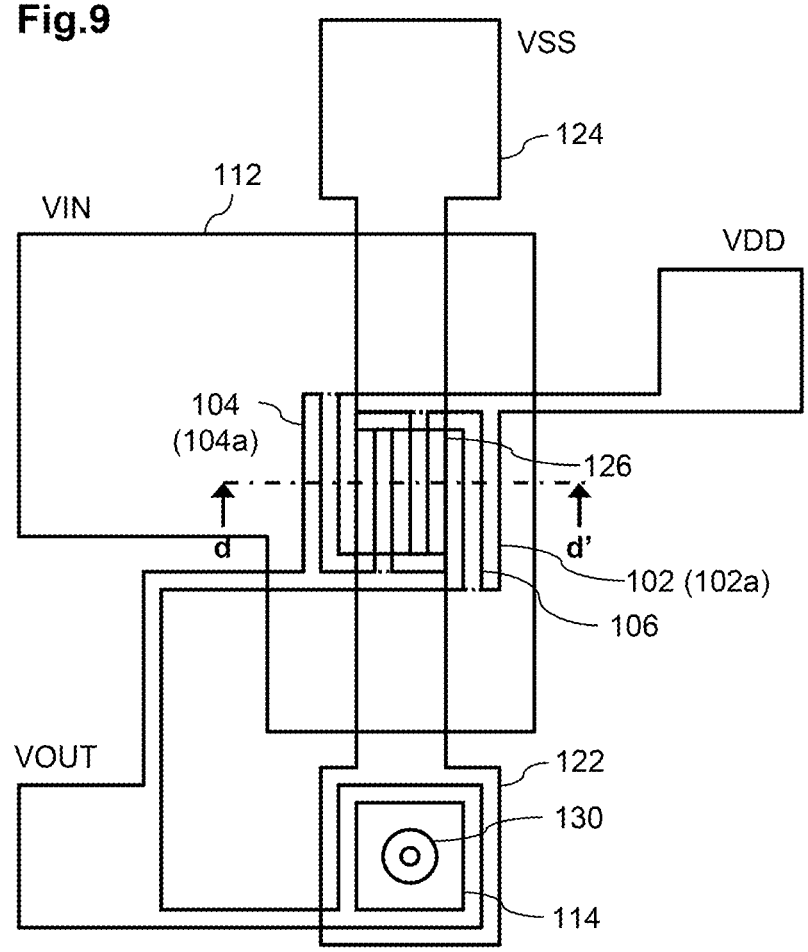
FIG. 9 is a fourth plan view of the inverter circuit constituted of the CMOS circuit.

FIG. 9 is a plan view of the inverter circuit constituted of the CMOS circuit according to the present embodiment. Referring to FIG. 9, the inverter circuit according to the present embodiment includes the p-type organic transistor PT and the n-type inorganic transistor NT. The p-type organic transistor PT includes a source electrode 102, a drain electrode 104, a gate insulating layer 110 (not illustrated) and an organic semiconductor layer 106a (not illustrated). The n-type inorganic transistor NT includes a source electrode 124, a drain electrode 122, a gate insulating layer 120 (not illustrated) and an inorganic semiconductor layer 126a (not illustrated).

Figure 10:
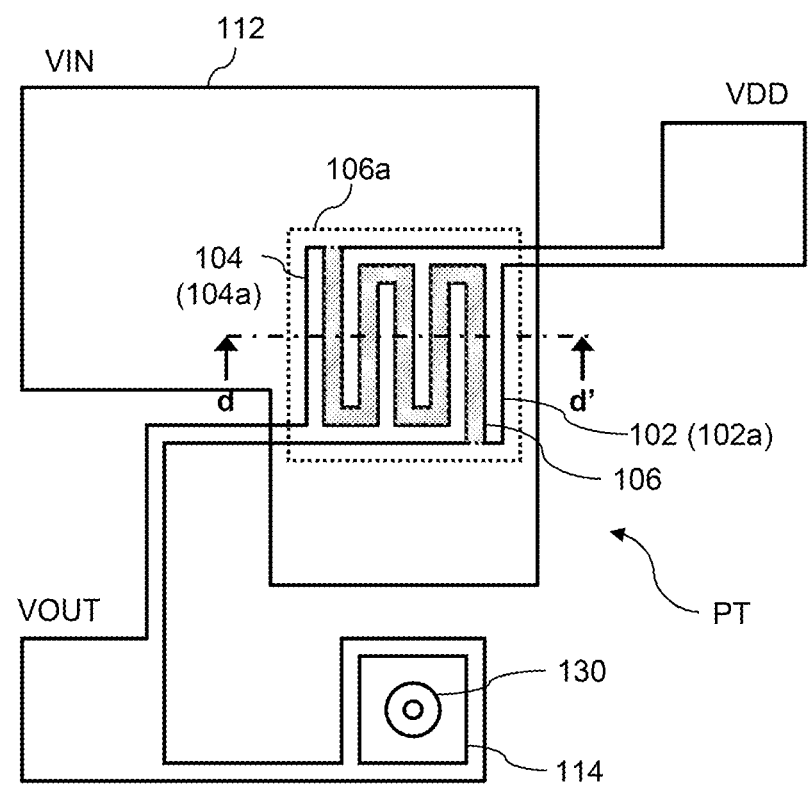
FIG. 10 is a fifth plan view of the inverter circuit constituted of the CMOS circuit.

FIG. 10 is a plan view illustrating the arrangement of the organic semiconductor layer 106a, the source electrode 102 and the drain electrode 104 of the p-type organic transistor PT formed on the substrate, and the gate electrode 112 formed on or above the p-type organic transistor PT; the above constituent parts are included in the CMOS circuit according to the present embodiment.

Figure 11:
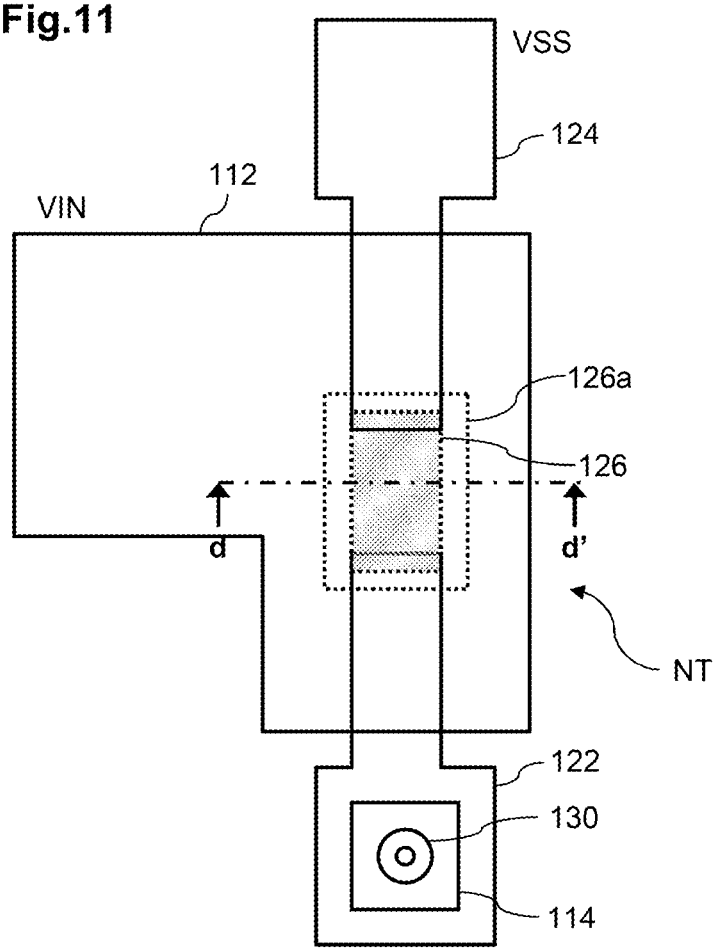
FIG. 11 is a sixth plan view of the inverter circuit constituted of the CMOS circuit.

FIG. 11 is a plan view illustrating the arrangement of the gate electrode 112 formed on or above the p-type organic transistor PT and below the n-type inorganic transistor NT, and the arrangement of the inorganic semiconductor layer 126a, the drain electrode 122, the source electrode 124 and the channel region 126 of the n-type inorganic transistor NT; the above constituent parts are included in the CMOS circuit according to the present embodiment.

Source Electrode 102 and Drain Electrode 104

Both the source electrode 102 and the drain electrode 104 of the p-type organic transistor PT have, as illustrated in FIG. 10, a comb-tooth shape. In a plan view, at least a part of one of the three comb teeth 102a of the source electrode 102 is formed so as to be disposed between the two adjacent comb teeth of the three comb teeth 104a of the drain electrode 104. Also, in a plan view, at least a part of one of the three comb teeth 104a of the drain electrode 104 is formed so as to be disposed between two adjacent comb teeth of the three comb teeth 102a of the source electrode 102. In other words, in at least one of the comb teeth 102a of the source electrode 102, at least the end of that comb tooth is disposed at a predetermined interval between two adjacent comb teeth of the drain electrode 104. Also, in at least one of the comb teeth 104a of the drain electrode 104, at least the end of that comb tooth is disposed at a predetermined interval between two adjacent comb teeth of the source electrode 102. Of the organic semiconductor layer 106a, a region between the comb teeth 102a and the comb teeth 104a adjacent to each other corresponds to the channel region 106.

Further, the comb teeth 102a of the source electrode 102 and the comb teeth 104a of the drain electrode 104 of the p-type organic transistor PT extend parallel to a direction from the source electrode 124 to the drain electrode 122 of the n-type inorganic transistor NT. In other words, the comb teeth 102a of the source electrode 102 and the comb teeth 104a of the drain electrode 104 extend in a longitudinal direction of the channel of the n-type inorganic transistor NT.

When this structure is used, a region can be arranged which doesn't have roughness caused by the comb teeth 102a of the source electrode 102 and the comb teeth 104a of the drain electrode 104 of the p-type organic transistor PT, along a longitudinal direction of the channel of the n-type inorganic transistor NT in an area extending from the end of the source electrode 124 side and the end of the drain electrode 122 side of the channel region 126 of the n-type inorganic transistor NT. However, when the comb teeth 102a and the comb teeth 104a are not parallel to a longitudinal direction of the channel of the n-type inorganic transistor NT, also, a region not having roughness caused by the comb teeth 102a and the comb teeth 104a along a longitudinal direction of the channel of the n-type inorganic transistor NT can be arranged. When the comb teeth 102a and the comb teeth 104a are parallel to a longitudinal direction of the channel of the n-type inorganic transistor NT, the area of the region not having roughness caused by the comb teeth 102a and the comb teeth 104a along a longitudinal direction of the channel of the n-type inorganic transistor NT can be maximized; thus the comb teeth 102a and the comb teeth 104a are preferably parallel to a longitudinal direction of the channel of the n-type inorganic transistor NT. However, in order to arrange a region not having the roughness along a longitudinal direction of the channel of the n-type inorganic transistor NT, the angle between the comb teeth 102a and comb teeth 104a and the longitudinal direction of the channel of the n-type inorganic transistor NT may be appropriately determined according to the interval between the comb teeth 102a and the comb teeth 104a adjacent to each other and to the channel length of the n-type inorganic transistor NT.

Cross-Sectional View Along Line d-d' in CMOS Circuit

Figure 12:
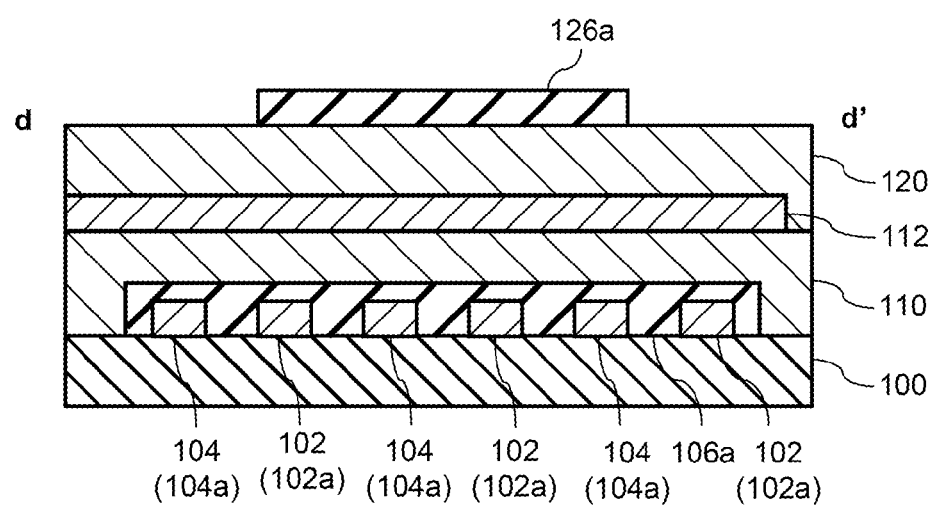
FIG. 12 is a cross-sectional view along the line d-d' in the CMOS circuit.

FIG. 12 is a cross-sectional view along the line d-d' in the CMOS circuit according to the present embodiment.

Source Electrode 102 and Drain Electrode 104 of P-Type Organic Transistor PT

Formed on the substrate 100 are the comb teeth 102a of the source electrode 102 and the comb teeth 104a of the drain electrode 104 of the p-type organic transistor PT composed of a conductive material. The comb teeth 102a of the source electrode 102 and the comb teeth 104a of the drain electrode 104 are, as illustrated in FIG. 12, alternately arranged at a predetermined interval. The conductive material constituting the source electrode 102 and the drain electrode 104 of the p-type organic transistor PT may be selected similarly to the material for the source electrode 102 and the drain electrode 104 of the p-type organic transistor PT described in Embodiment 1.

Channel Region 106 of P-Type Organic Transistor PT

Further formed on or above the substrate 100 is the organic semiconductor layer 106a, and the region between the comb teeth 102a and the comb teeth 104a adjacent to each other corresponds to the channel region 106. The organic conductive material constituting the organic semiconductor layer 106a may be selected similarly to the material for the channel region 106 of the p-type organic transistor PT described in Embodiment 1.

Summary

In the semiconductor device according to the present embodiment, in addition to the structure according to Embodiment 1, the source electrode 102 and the drain electrode 104 of the p-type organic transistor PT are, as described above, formed to have a comb-tooth shape, and one of the comb teeth of the one electrode is formed so as to be disposed between two adjacent comb teeth of the other electrode. Accordingly, in addition to the effects achieved by the structure according to Embodiment 1, the following advantageous effects are achieved.

The current driving capacity of a transistor is determined by factors such as the channel length, the channel width and the mobility of the transistor. Here, the mobility of an organic transistor is typically lower than that of an inorganic transistor, and thus the current driving capacity of the organic transistor is lower than that of the inorganic transistor. That is, in the semiconductor device according to the present embodiment, the current driving capacity of the p-type organic transistor PT is lower than that of the n-type inorganic transistor NT. In the semiconductor device, when there is a large difference of current driving capacity between the p-type organic transistor PT and the n-type inorganic transistor NT, the circuit operation may be unstable, which is not preferable. However, the current driving capacity can be, as described above, raised by varying the channel length or the like of the transistor.

In the semiconductor device according to the present embodiment having the above structure, the channel width of the channel region 106 of the p-type organic transistor PT can be enlarged, so that the current driving capacity of the p-type organic transistor PT is raised. As a result, the difference in current driving capacity between the p-type organic transistor PT and the n-type inorganic transistor NT can be lessened, so that the circuit operation is stabilized.

In the semiconductor device according to the present embodiment, the comb teeth 102a of the source electrode 102 and the comb teeth 104a of the drain electrode 104 of the p-type organic transistor PT extend in a direction from the source electrode 124 to the drain electrode 122 of the n-type inorganic transistor NT.

In the channel region of the transistor, when there is roughness in a direction (longitudinal direction of channel) from the source electrode to the drain electrode, the channel region may be partially thin or thick, causing a problem of unsmoothed current flow or the like. As a result, the operation of the transistor may be unstable. The roughness in the channel region is caused by electrode wiring or the like formed below the channel region.

In the semiconductor device having the above structure, a region may be arranged which doesn't have roughness caused by the comb teeth 102a of the source electrode 102 and the comb teeth 104a of the drain electrode 104 of the p-type organic transistor PT, along a longitudinal direction of the channel of the n-type inorganic transistor NT in an area extending from the end of the source electrode 124 side to the end of the drain electrode 122 side of the channel region 126 of the n-type inorganic transistor NT. Accordingly, the operation of the n-type inorganic transistor NT is stable, so that the semiconductor device with stable operation can be provided.

In the present embodiment, an example has been described in which both the source electrode 102 and the drain electrode 104 of the p-type organic transistor PT have a comb-tooth shape. However, in Embodiment 1, for example, when the distance between the source electrode 102 and the drain electrode 104 of the p-type organic transistor PT is lessened to decrease the channel length of the p-type organic transistor PT, also, the similar effects are achieved. That is, irrespective of the configuration of the source electrode 102 and the drain electrode 104, when the source electrode 102 and the drain electrode 104 are arranged so that a region is arranged which doesn't have roughness caused by the source electrode 102 and the drain electrode 104 of the p-type organic transistor PT, along a longitudinal direction of the channel of the n-type inorganic transistor NT in an area extending from the end of the source electrode 124 side to the end of the drain electrode 122 side of the channel region 126, the semiconductor device with stable operation can be provided. And when the source electrode 102 and the drain electrode 104 are arranged to maximize the area of the region not having the roughness, the effect of stabilizing the operation of the n-type inorganic transistor NT is maximized.

Supplement

According to the present embodiment, the source electrode 102, the drain electrode 104, the gate electrode 112 and the electrical conductor 114 of the p-type organic transistor PT, and the drain electrode 122 and the source electrode 124 of the n-type inorganic transistor NT, and the interlayer contact 130 are composed of a conductive material, but may be, similarly to Embodiment 1, composed of a conductive material different from each other. The gate insulating layers 110 and 120 may also be composed of a conductive material different from each other.

5. Exemplary Structure of Electronic Apparatus Including Semiconductor Device

Figure 13:
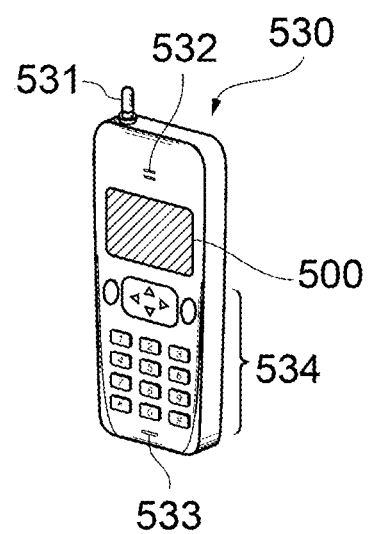
FIG. 13 is a perspective view of a mobile phone including the semiconductor device according to the present embodiment.

An illustrative example of electronic apparatus including the semiconductor device according to the present invention will be described with reference to FIG. 13. FIG. 13 illustrates an example in which the present invention is applied to a mobile phone. A mobile phone 530 includes an antenna 531, a voice output section 532, a voice input section 533, an operating section 534 and an electrooptic device 500. The electrooptic device 500 includes the semiconductor device described in Embodiments 1 and 2.

The semiconductor device described in Embodiments 1 and 2 can be used in an electronic component such as a memory, radio tag, IC tag, pressure sensor, temperature sensor, optical sensor, acceleration sensor, distortion sensor, magnetic sensor, humidity sensor, capacitor, voltage sensor or chemical sensor. Further, the present invention can also be used in various electronic apparatuses including the above component, such as a liquid crystal display apparatus, organic EL display apparatus, mobile phone or notebook PC.

The electronic apparatus having the above structure has the features of any of the above described semiconductor devices. Thus, the semiconductor device having a smaller area can be used, for example, so that an electronic apparatus of a smaller size is provided.

The above description is about the embodiments of the present invention. The embodiments described above are merely exemplary of the present invention, and are not be construed to limit the scope of the present invention. Many modifications to the embodiments are possible without departing from the gist of the invention. An embodiment with such modifications applied thereto can also be included in the scope of the invention. Also, the embodiments can be combined without causing contradiction.

What is claimed is:

1. A semiconductor device comprising:
   a substrate;
   a p-type organic transistor including an organic semiconductor layer arranged on or above the substrate; and
   an n-type inorganic transistor including an inorganic semiconductor layer arranged on or above the organic transistor, wherein a channel region of the inorganic transistor overlaps a channel region of the organic transistor at least partially in a plan view and a gate insulating layer of the inorganic transistor is arranged in a manner covering the organic semiconductor layer,
   wherein a whole of the organic semiconductor layer overlaps the gate insulating layer of the inorganic transistor in a plan view and an area of the organic semiconductor layer is larger than an area of the inorganic semiconductor layer.

2. The semiconductor device according to claim 1,
   wherein an electrode functioning as a gate electrode of the organic transistor and also functioning as a gate electrode of the inorganic transistor is arranged above a gate insulating layer of the organic transistor and below the gate insulating layer of the inorganic transistor.

3. The semiconductor device according to claim 1,
   wherein the organic transistor has a top gate structure and the inorganic transistor has a bottom gate structure; and
   a CMOS circuit is formed by the organic transistor and the inorganic transistor.

4. The semiconductor device according to claim 2,
   wherein any one of a source electrode and a drain electrode of the organic transistor is electrically connected, via a first electrical conductor arranged to extend from the gate insulating layer of the organic transistor to the gate insulating layer of the inorganic transistor, to any one of a source electrode and a drain electrode of the inorganic transistor; and
   a second electrical conductor electrically connected to the first electrical conductor is arranged between the gate insulating layer of the organic transistor and the gate insulating layer of the inorganic transistor.

5. The semiconductor device according to claim 2,
   wherein the gate electrode and any one of a source electrode and a drain electrode of the inorganic transistor are connected via a first electrical conductor arranged to extend from the gate insulating layer of the organic transistor to the gate insulating layer of the inorganic transistor; and
   a second electrical conductor electrically connected to the first electrical conductor is formed below the gate insulating layer of the organic transistor.

6. The semiconductor device according to claim 1,
   wherein both the source electrode and the drain electrode of the organic transistor have a comb-tooth shape, and some of the comb teeth of one electrode are arranged so as to be disposed between the comb teeth of the other electrode.

7. The semiconductor device according to claim 6,
   wherein at least one of the source electrode and the drain electrode of the organic transistor is arranged in a region overlapping the channel region of the inorganic transistor in a plan view; and
   a region is arranged in which neither of the source electrode and the drain electrode of the organic transistor is arranged along a longitudinal direction of the channel of the inorganic transistor in an area extending from the end of the source electrode side of the inorganic transistor to the end of the drain electrode side of the inorganic transistor of the channel region of the inorganic transistor.

8. The semiconductor device according to claim 1,
   wherein at least one of a source electrode and a drain electrode of the organic transistor is formed in the outside of the channel region of the inorganic transistor in a plan view.

9. The semiconductor device according to claim 1,
   wherein the gate insulating layer of the inorganic transistor is formed of a polymer.

10. An electronic apparatus comprising a semiconductor device according to claim 1.

11. The semiconductor device according to claim 1, wherein between the gate insulating layer of the inorganic transistor and the organic semiconductor layer, a gate insulating layer of the organic transistor is arranged in a manner covering the organic semiconductor layer.

\* \* \* \* \*